(12) United States Patent
Dutta et al.

(10) Patent No.: US 12,550,384 B2
(45) Date of Patent: Feb. 10, 2026

(54) MEMORY DEVICES

(71) Applicant: GLOBALFOUNDRIES U.S. Inc., Malta, NY (US)

(72) Inventors: Anupam Dutta, Krishnapur (IN); Partha S. Gupta, Dhakuria (IN)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 743 days.

(21) Appl. No.: 17/849,279

(22) Filed: Jun. 24, 2022

(65) Prior Publication Data
US 2023/0420561 A1   Dec. 28, 2023

(51) Int. Cl.
| H10D 30/69 | (2025.01) |
| H10B 99/00 | (2023.01) |
| H10D 62/80 | (2025.01) |
| H10D 86/00 | (2025.01) |

(52) U.S. Cl.
CPC ........... *H10D 30/711* (2025.01); *H10B 99/22* (2023.02); *H10D 62/80* (2025.01); *H10D 86/201* (2025.01)

(58) Field of Classification Search
CPC .... H10D 30/711; H10D 86/201; H10D 62/80; H10D 12/211; H10D 62/116; H10D 84/80; H10B 99/22
See application file for complete search history.

(56) References Cited

U.S. PATENT DOCUMENTS

| 6,111,778 | A | 8/2000 | MacDonald et al. |
| 8,498,140 | B2 | 7/2013 | Fossum et al. |
| 2006/0289904 | A1* | 12/2006 | Tsujiuchi .......... H01L 21/76283 |
| | | | 257/E29.147 |
| 2008/0150023 | A1* | 6/2008 | Nishisaka .......... H10D 30/0323 |
| | | | 257/E29.279 |
| 2014/0346597 | A1* | 11/2014 | Feilchenfeld ...... H10D 30/0281 |
| | | | 438/286 |
| 2019/0096889 | A1* | 3/2019 | Widjaja ................ G11C 11/403 |
| 2022/0028971 | A1* | 1/2022 | Rana ................. H01L 21/76264 |
| 2022/0085168 | A1* | 3/2022 | Han .................... G11C 16/0416 |
| 2022/0285551 | A1* | 9/2022 | Yang .................. H10D 30/0281 |

OTHER PUBLICATIONS

Okhonin et al., "A SOI capacitor-less 1T-DRAM concept", 2001 IEEE International SOI Conference, Oct. 2001, Abstract, 2 pages.
Wann et al., "A capacitorless DRAM cell on SOI substrate", Proceedings of IEEE International Electron Devices Meeting, Aug. 2002, Abstract, 2 pages.
Yoshida et al., "A Capacitorless 1T-DRAM Technology Using Gate-Induced Drain-Leakage (GIDL) Current for Low-Power and High-Speed Embedded Memory", IEEE Transactions on Electron Devices, Mar. 27, 2006, vol. 53, Issue 4, Abstract, 2 pages.

* cited by examiner

Primary Examiner — Shaun M Campbell
(74) Attorney, Agent, or Firm — Andrew M. Calderon; Calderon Safran & Wright P.C.

(57) ABSTRACT

The present disclosure relates to semiconductor structures and, more particularly, to memory devices and methods of manufacture. The structure includes: a gate structure having a gate dielectric material and a gate body; a body region under the gate dielectric material; a first doped region laterally adjacent to a first side of the body region; a second doped region laterally adjacent to the first doped region; and a shallow trench isolation structure laterally adjacent to a second side of the body region.

18 Claims, 11 Drawing Sheets

WRITE1
(W1)

HOLD1
(H1)

WRITE0
(W0)

HOLD0
(H0)

MEMORY DEVICES

BACKGROUND

The present disclosure relates to semiconductor structures and, more particularly, to memory devices and methods of manufacture.

ZRAM is a type of memory which creates a block device in RAM where pages that would otherwise be written to swap (disk/SSD) are first compressed, then stored. This allows for a much faster I/O of swap, and also, the data compression provides a significant amount of memory savings. ZRAM uses a current sensing method for memory read; however, this sensing method is destructive and consumes large amounts of power.

SUMMARY

In an aspect of the disclosure, a structure comprises: a gate structure comprising a gate dielectric material and a gate body; a body region under the gate dielectric material; a first doped region laterally adjacent to a first side of the body region; a second doped region laterally adjacent to the first doped region; and a shallow trench isolation structure laterally adjacent to a second side of the body region.

In an aspect of the disclosure, a structure comprises: a semiconductor layer; a gate structure over the semiconductor layer; a floating body region in the semiconductor layer and under the gate structure; a body contact electrically connecting to the floating body region; a shallow trench isolation structure between the body contact and the floating body region; an N− region laterally adjacent to the body region; and an N+ region laterally adjacent to the N− region and spaced away from the floating body region.

In an aspect of the disclosure, a method comprises: forming a gate structure comprising a gate dielectric material and a gate body; forming a body region under the gate dielectric material; forming a first doped region laterally adjacent to a first side of the body region; forming a second doped region laterally adjacent to the first doped region; and forming a shallow trench isolation structure laterally adjacent to a second side of the body region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to memory devices and methods of manufacture. In embodiments, the memory devices may be compact ZRAM devices using an output voltage for read operations. More specifically, the compact ZRAM devices comprise a read method with a writing mechanism through usage of gate oxide tunneling current, e.g., read operations are accomplished through a change in body potential and write operations are accomplished through a gate current. Advantageously, the ZRAM devices are non-destructive and consume very low power.

In more specific embodiments, the semiconductor device (e.g., memory device) includes a thin gate oxide and a junction engineered diode. More specifically, the memory device may include a lateral $P^+$-STI-N-$N^+$ structure with a thin gate dielectric (e.g., oxide). In this structure, the memory devices exhibit ultra-low power readings as no current is drawn during read operations; instead, read operations are provided by a voltage change in the floating body region of a gate structure.

The ZRAM devices of the present disclosure can be manufactured in a number of ways using a number of different tools. In general, though, the methodologies and tools are used to form structures with dimensions in the micrometer and nanometer scale. The methodologies, i.e., technologies, employed to manufacture the ZRAM devices of the present disclosure have been adopted from integrated circuit (IC) technology. For example, the structures are built on wafers and are realized in films of material patterned by photolithographic processes on the top of a wafer. In particular, the fabrication of the ZRAM devices uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
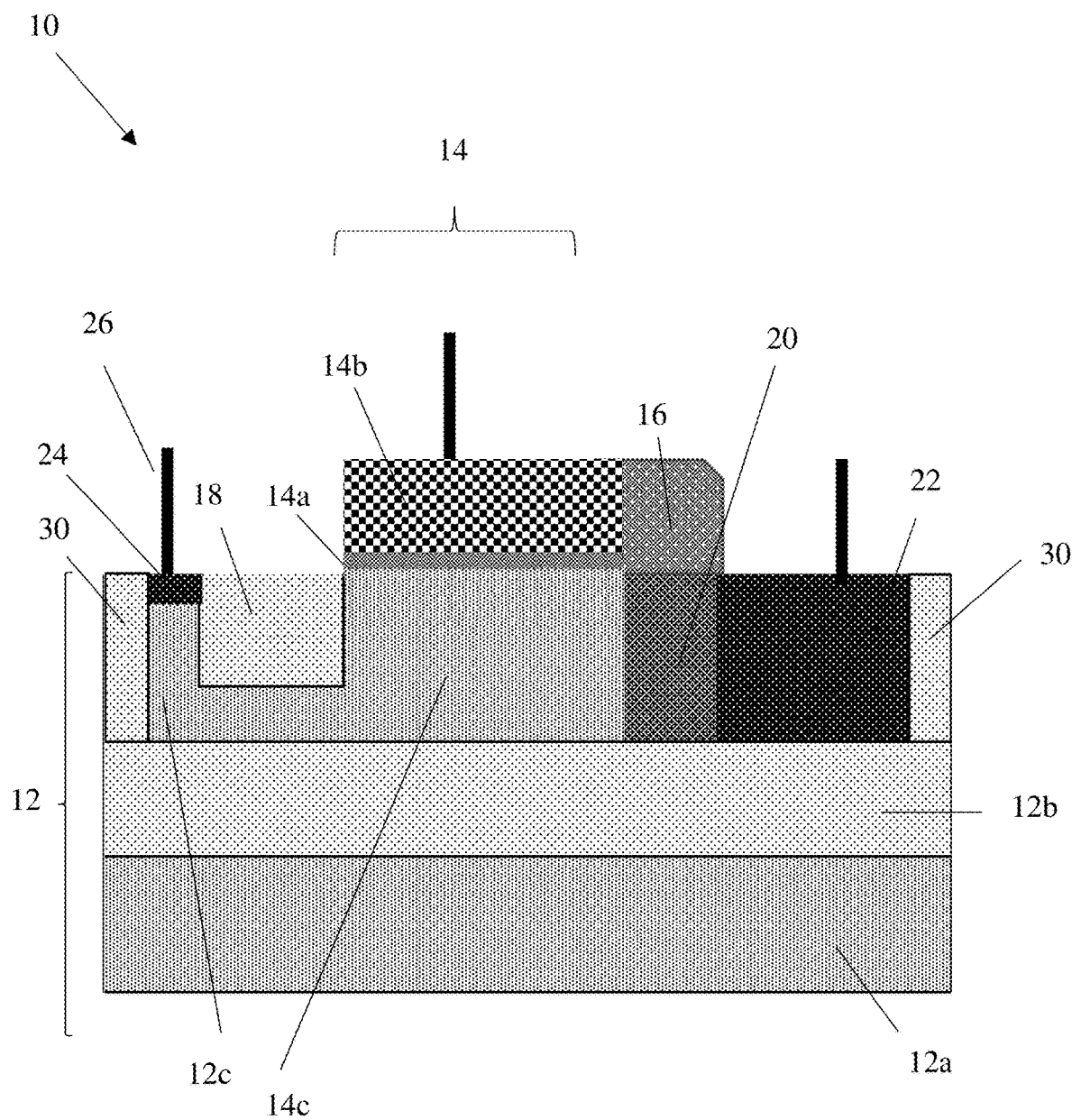
FIG. 1 shows a memory device and respective fabrication processes in accordance with aspects of the present disclosure.

FIG. 1 shows a memory device in accordance with aspects of the present disclosure. In embodiments, the memory device 10 includes a substrate 12 which may include semiconductor-on-insulator (SOI) technology; although embodiments contemplate the substrate 12 comprises a bulk substrate of any suitable semiconducting materials. In embodiments, the substrate 12 comprises a P+ substrate.

In the SOI technology, for example, the substrate 12 may include a handle substrate 12a, a buried insulator layer 12b and a semiconductor layer 12c on the buried insulator layer 12b. The handle substrate 12a provides mechanical support to the buried insulator layer 12b and the semiconductor layer 12c. In embodiments, the handle substrate 12a and the semiconductor layer 12c may include any suitable semiconductor material such as, for example, Si, Ge, SiGe, SiC, SiGeC, GaAs, InAs, InP, and other III/V or II/VI compound semiconductors or any combinations thereof. The semiconductor layer 12c may also comprise any suitable crystallographic orientation (e.g., a (100), (110), (111), or (001) crystallographic orientation), with a P+ profile.

The buried insulator layer 12b may include a dielectric material such as silicon dioxide, silicon nitride, silicon oxynitride, boron nitride or a combination thereof. In one embodiment, the buried insulator layer may be formed by a deposition process, such as chemical vapor deposition (CVD), plasma enhanced chemical vapor deposition CVD (PECVD), physical vapor deposition (PVD) or a thermal growth process, such as thermal oxidation, to convert a surface portion of the handle substrate 12a. In yet another embodiment, the buried insulator layer 12b can be formed by implanting oxygen atoms into a bulk semiconductor substrate and thereafter annealing the structure. The semiconductor layer 12c can be formed by a deposition process, such as CVD, PECVD or a smart cut process.

A gate structure 14 may be formed on the semiconductor layer 12c. The gate structure 14 comprises a gate dielectric material 14a and gate body 14b. The gate dielectric material 14a may be a thin gate oxide material or a high-k gate dielectric material, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. In embodiments, the gate dielectric material 14a may have a thickness of about 1.5 nm; although other dimensions are contemplated herein which would exhibit gate leakage so that electron holes can accumulate in a floating body region 14c provided in the semiconductor layer 12c below the gate structure 14. The gate body 14b may be, e.g., polysilicon material.

Figure 6A:
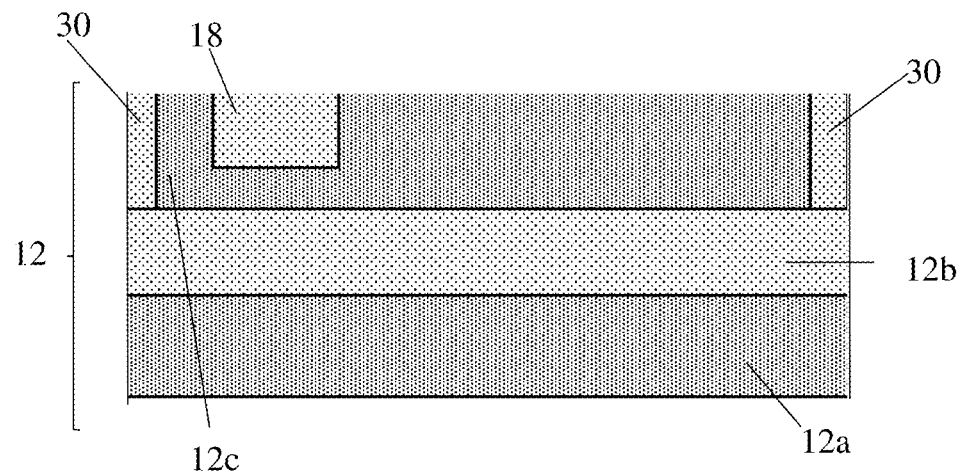
FIGS. 6A-6D show fabrication processes for manufacturing the device shown in FIG. 1, in accordance with aspects of the present disclosure.
Figure 6B:
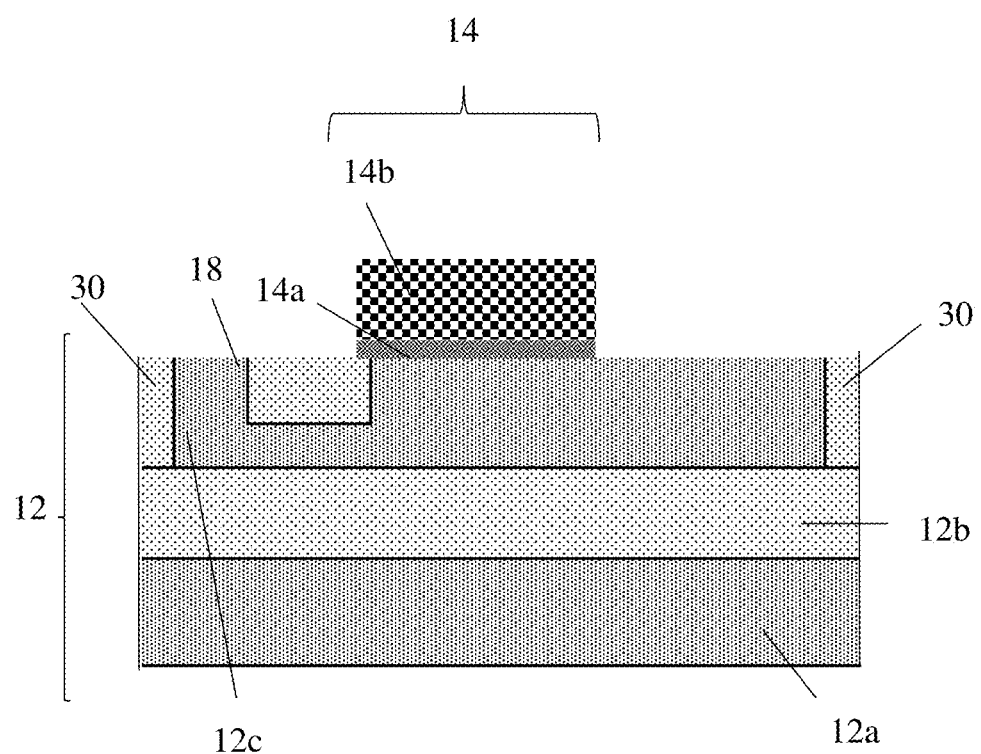

The gate structure 14 may be formed by conventional deposition, lithography and etching processes as described with respect to FIG. 6B. For example, the gate dielectric material 14a and the gate material 14b may be deposited by conventional deposition methods, e.g., atomic layer deposition (ALD), CVD, PECVD, etc., followed by a patterning process using known lithography and etching processes, e.g., reactive ion etching processes (RIE).

A sidewall spacer 16 may be provided on a sidewall of the gate structure 14. In embodiments, the sidewall spacer 16 may be an oxide and/or nitride material, e.g., SiN. Although shown on a single side of the gate structure 14, the sidewall spacer 16 may also be formed around the gate structure 14. In embodiments, the sidewall spacer 16 may be formed by a conventional blanket deposition process over the gate structure 14, followed by an anisotropic etching process which includes a lateral etching component that etches (e.g., removes) the horizontal surfaces of the material used for the sidewall spacer 16.

Still referring to FIG. 1, the floating body region 14c may be a floating P– body region bounded by a shallow trench isolation structure 18 and an N– region 20. In embodiments, the shallow trench isolation structure 18 is an ultra-shallow trench isolation structure 18, which extends only partially into the semiconductor layer 12c, i.e., does not extend to the underlying buried insulator layer 12b. In embodiments, the ultra-shallow trench isolation structure 18 may be about 50 nm to 60 nm deep, as an illustrative non-limiting example. In this way, a charge path can be provided from a body contact 24, e.g., P+ contact, to the floating P– body region 14c.

The N– region 20 may be laterally adjacent to the body region 14c on a first side of the gate structure 14, provided under the sidewall spacer 16. A heavily doped N+ region 22 may be laterally adjacent to the N– region 20, spaced away from the body region 14c. In specific embodiments, the N+ region 22 has a higher dopant concentration than the N– region 20. The N– type dopants may be, e.g., Arsenic (As), Phosphorus (P) and Antimony (Sb). In embodiments, the use of Arsenic with a low diffusion concentration may result in a steeper junction.

The body contact 24 may be a P+ doped region comprising, e.g., Boron, on an opposing side of the shallow trench isolation structure 18. In alternative embodiments, the body contact 24 may be a silicide, e.g., NiSi, on the semiconductor layer 12c.

Figure 6C:
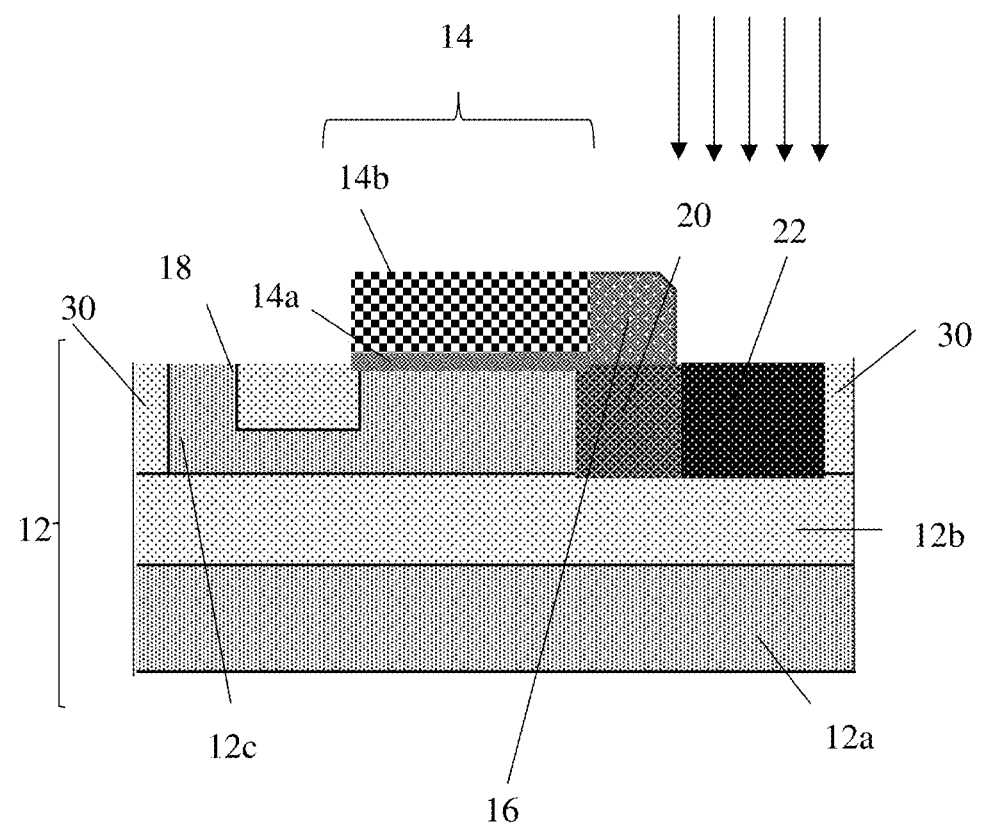
Figure 6D:
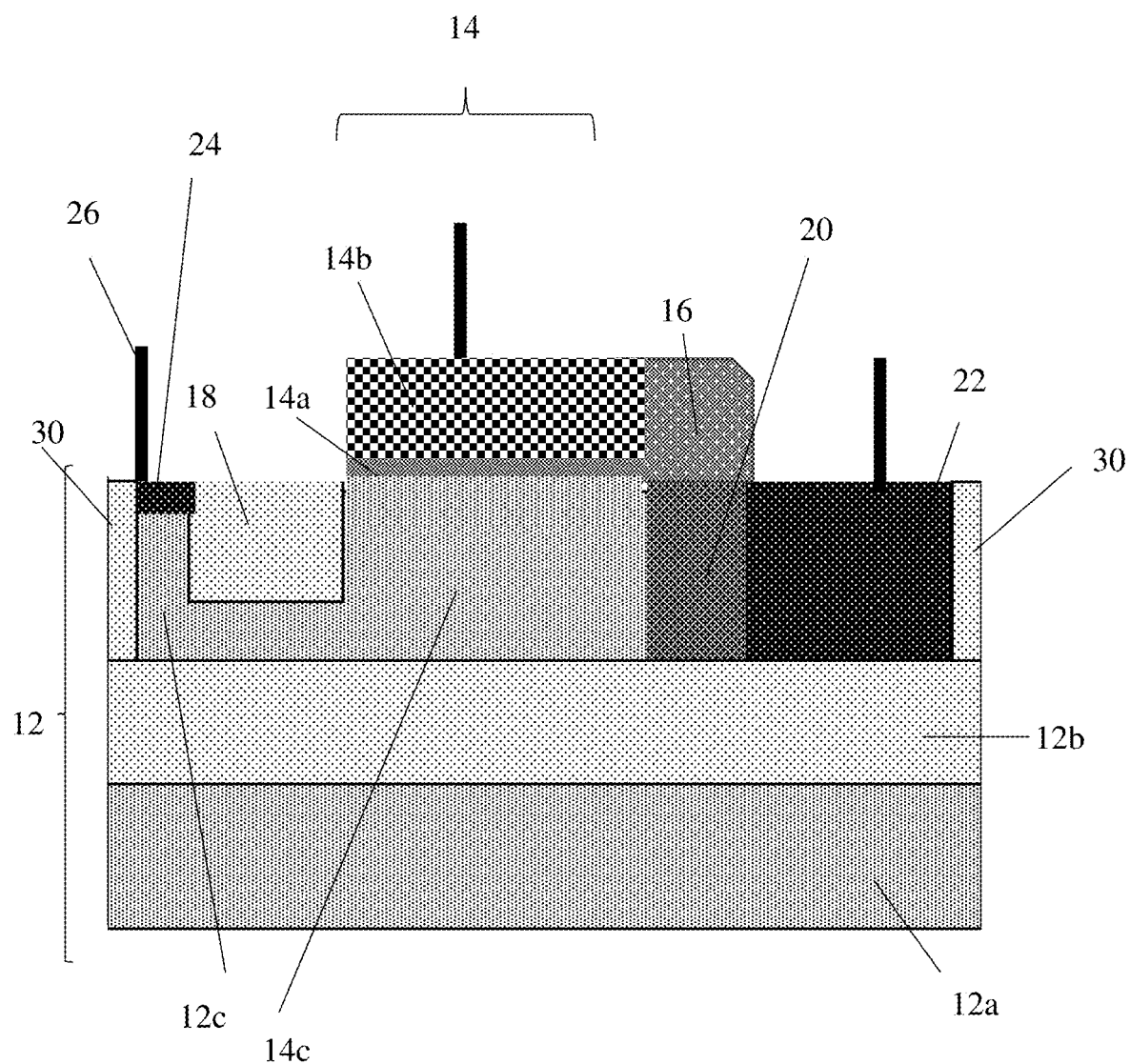

The N– region 20, N+ region 22 and P+ body contact 24 may be formed by ion implantation processes as described in more detail with respect to FIGS. 6C and 6D. In embodiments, the dopant for the N+ region 22 may be engineered for low capacitance applications, as an example, with the dopant for the N– region 20 and N+ region 22 being engineered for controlling the junction capacitance, e.g., low junction capacitance.

In embodiments, the shallow trench isolation structure 18 may control hole confinement within the body region 14c. Moreover, in embodiments, the shallow trench isolation structure 18 may be used to control mask alignment for the body contact 24 and the N– region 20. Moreover, the N– region 20 and the N+ region 22 may be used to control dynamic response at high frequency operation.

Contacts 26 are provided to the N+ region 22 and body contact 24. Moreover, shallow trench isolation structures 30 may be provided adjacent to the N+ region 22 and the body contact 24. In embodiments, the shallow trench isolation structures 30 may extend to the underlying buried insulator layer 12b, which effectively isolates the device.

Figure 2:
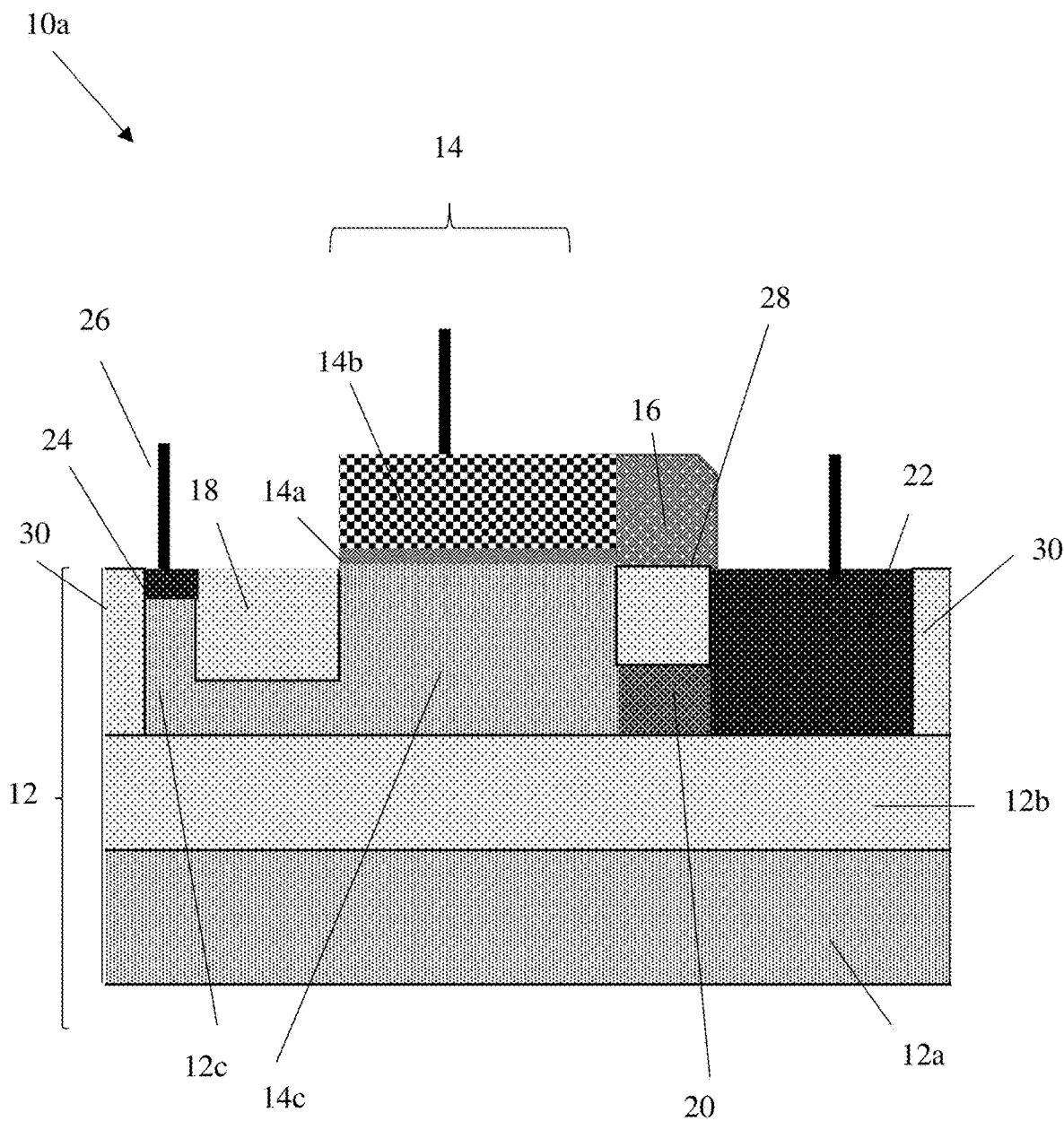
FIG. 2 shows a memory device and respective fabrication processes in accordance with additional aspects of the present disclosure.

FIG. 2 shows a memory device in accordance with additional aspects of the present disclosure. The memory device 10a includes a shallow trench isolation structure 28 within the N– region 20. The shallow trench isolation structure 28 may be an ultra-shallow trench isolation structure 28, which extends partially into the semiconductor layer 12c, i.e., does not extend to the buried insulator layer 12b. The combination of the shallow trench isolation structure 28 and N– region 20 may be used to control dynamic behavior of the device. The remaining features of the structure 10a are similar to the structure 10 described in FIG. 1.

FIGS. 3A-3D graphically illustrate the write, erase and hold time operations of the device 10. FIG. 4 shows a timing graph depicting the write, erase and hold time operations in accordance with the operations shown in FIGS. 3A-3D. It should be recognized that FIGS. 3A-3D may also graphically illustrate the operation of the device 10a of FIG. 2.

Figure 3A:
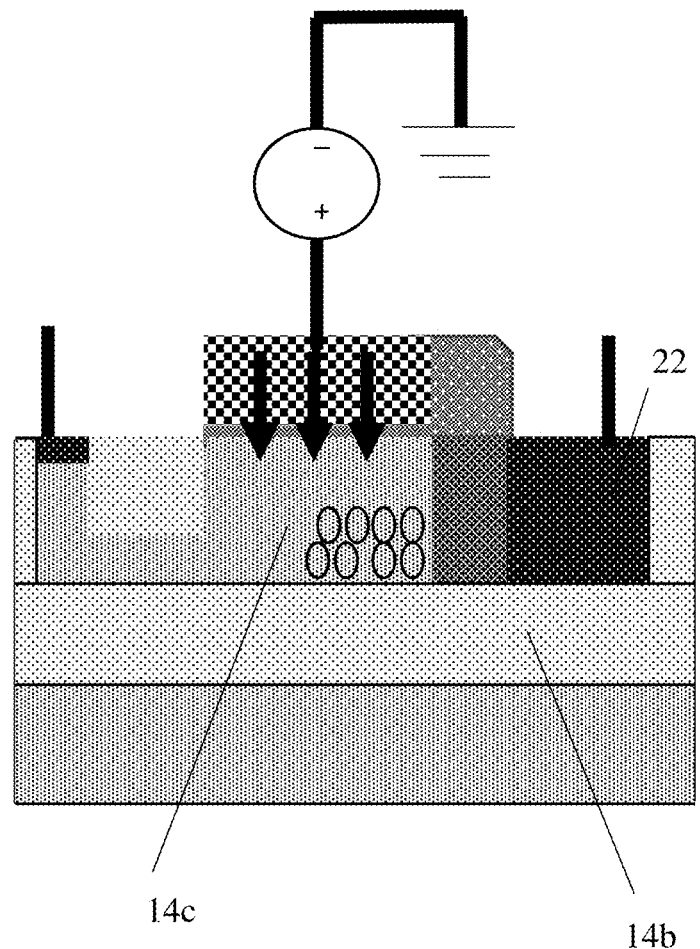
FIGS. 3A-3D graphically illustrate the operation of the device shown in FIG. 1.
Figure 4:
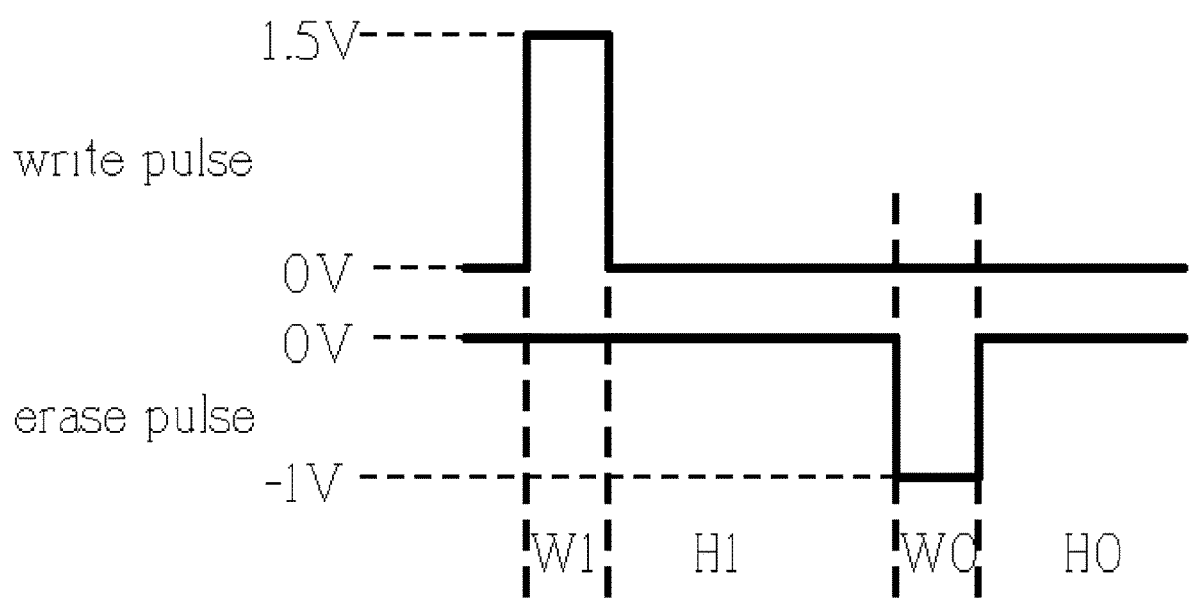
FIG. 4 shows a timing graph depicting write, erase and hold time operations in accordance with the operations shown in FIGS. 3A-3D.

In FIG. 3A, in a WRITE1 operation, electrons from valence band tunnel through the gate dielectric (e.g., gate oxide) leaving behind holes in the body region 14c and continue to accumulate in the floating body region 14c due to Electron Valence Band (EVB). This is shown in FIG. 4 as a 1.5V being applied at W1. In this operational state, the N+ region 22 is held grounded. Also, as should be understood by those of skill in the art, the holes will raise the potential of the floating body region 14c, with the holes continuing to accumulate in the floating body region 14c until the diode (e.g., junction between the floating body region 14c and the N– region 20) becomes sufficiently forward bias. The increase in the floating body potential is sensed as stored "1".

Figure 3B:
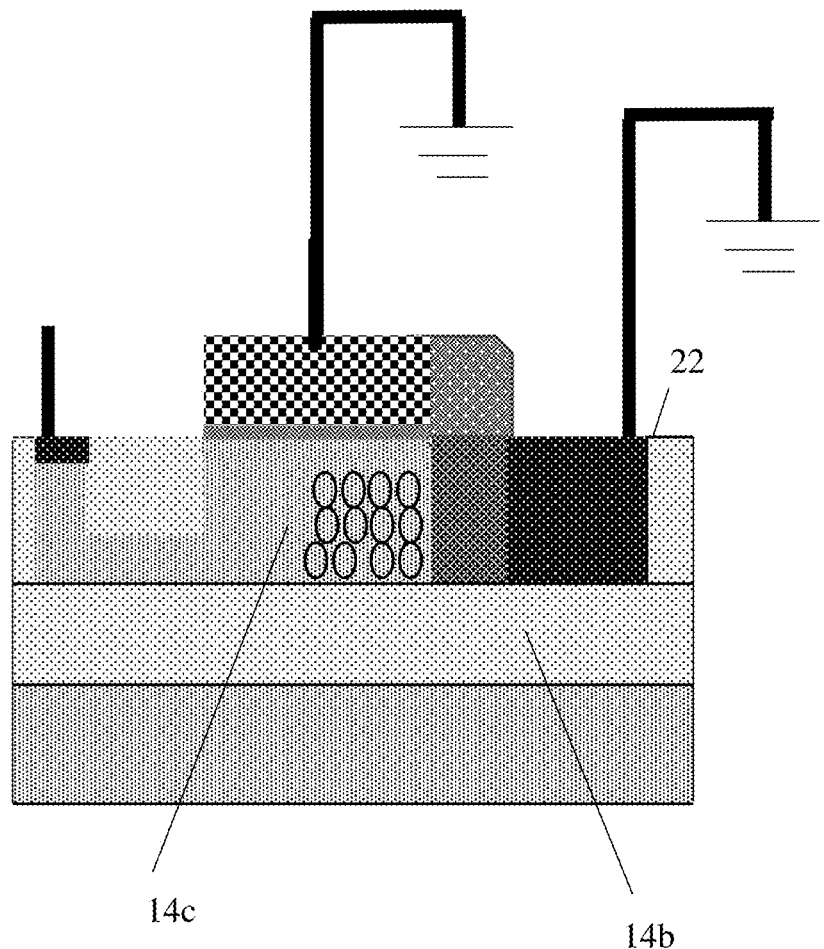

FIG. 3B representatively shows a hold state, HOLD1, after the write operation, WRITE1. In this operation state, both the gate structure 14 and the N+ region 22 are held at ground. This operational state can be held for a long time due to the fact that the electron holes are retained in the floating body region 14c by the shallow trench isolation structure 18, the N– region 20 and underlying buried insulator layer 12b. For example, in this operational state, the underlying buried insulator layer 12b will prevent leakage into the underlying handle substrate 12a; whereas the shallow trench isolation structure 18 and the N– region 20 will constrain the electron holes within the floating body region 14c. This operational state is shown in the timing graph of FIG. 4 as H1.

Figure 3C:
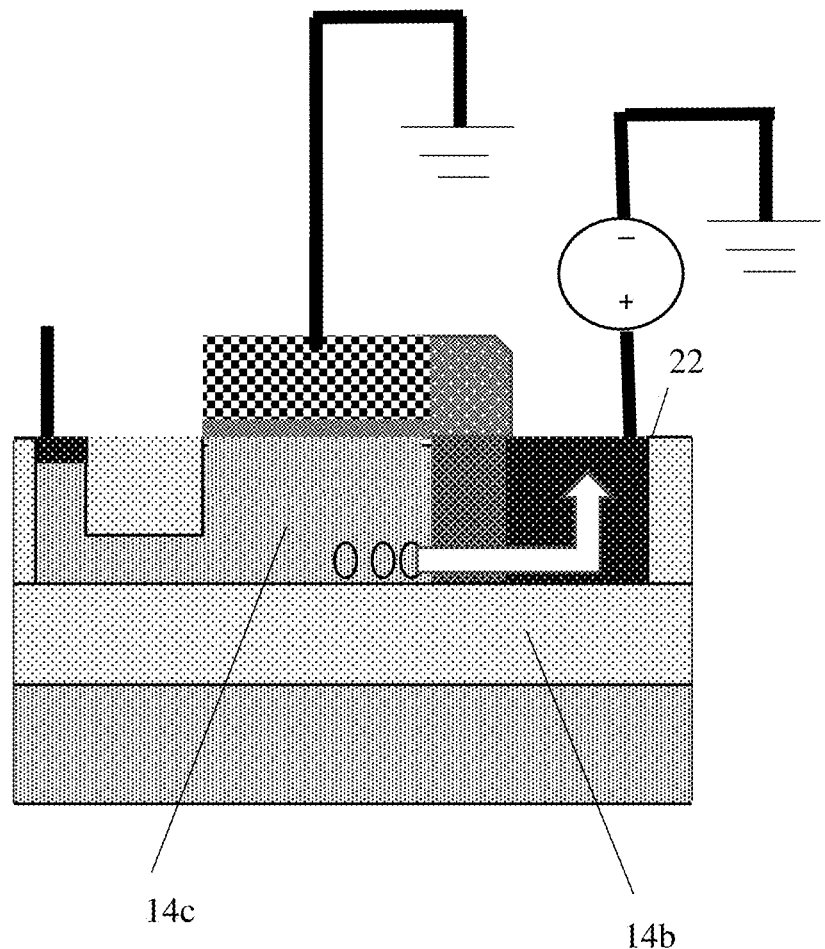

In the WRITE0 operation shown in FIG. 3C, to erase the memory the diode D (e.g., junction between the floating P-body region 14c and the N− region 20) is sufficiently forward biased by applying a negative voltage to the N+ region 22. This negative bias will remove the stored electron holes in the floating body region 14c such that the body potential will reach a very low value. This low value is sensed as "0". This is also shown in the timing graph of FIG. 4 as a −1.0V applied at W0.

Figure 3D:
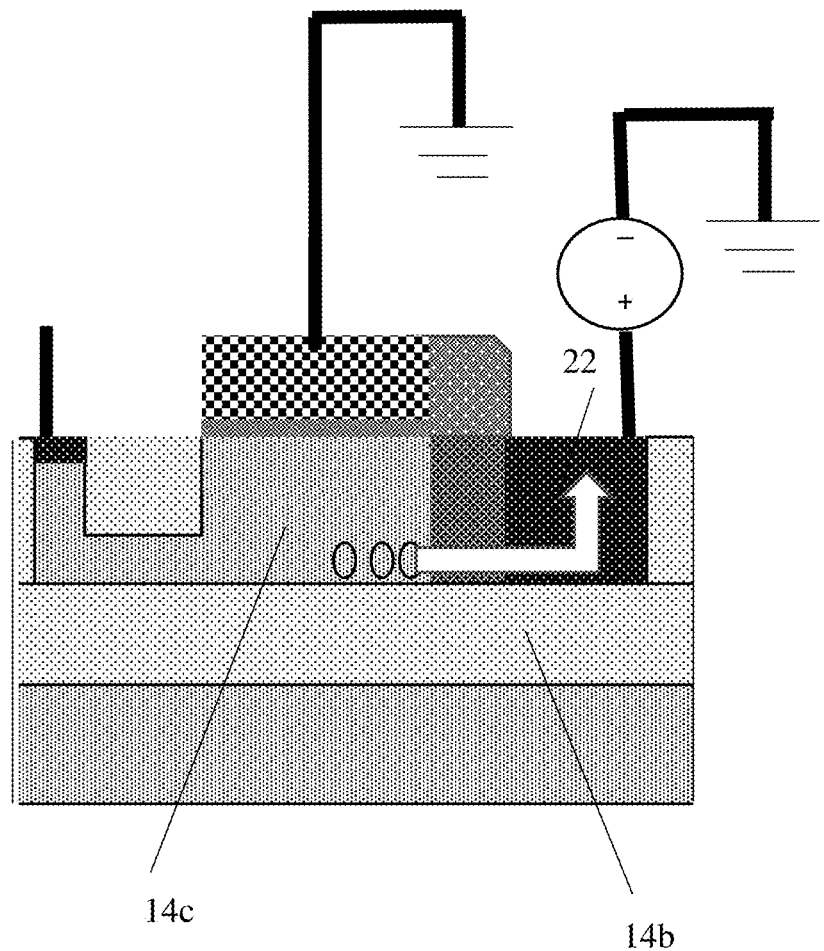

FIG. 3D shows a hold state (HOLD0) after electron hole extraction, which is also shown in FIG. 4 as H0. In embodiments, H0 may be held for a long time without producing any additional holes.

Table 1 below shows biasing during the different operational states, e.g., WRITE1, HOLD1, WRITE0 and HOLD0. As shown in Table 1, a 1.5 V bias is applied to the gate (e.g., VG) during WRITE1 and −1.0 V bias is applied to the N+ region 22 (e.g., VD) during WRITE0. No voltage need be applied to the body contact 24.

TABLE 1

| BIAS (V) | Write: 1 | Hold: 1 | Write: 0 | Hold: 0 |
|---|---|---|---|---|
| VG | 1.5 | 0 | 0 | 0 |
| VD | 0 | 0 | −1.0 | 0 |
| Vsub | 0 | 0 | 0 | 0 |

Figure 5A:
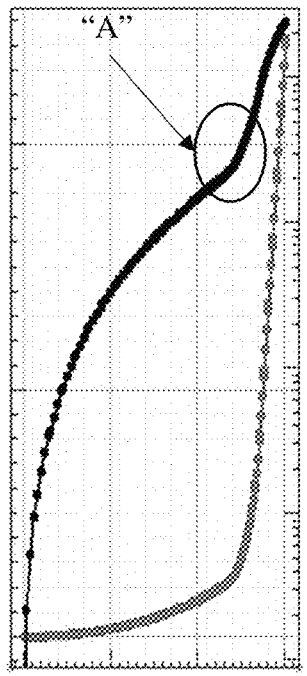
FIG. 5A shows a simulation of gate current vs. gate voltage of the device shown in FIG. 1.

FIG. 5A shows a simulation of gate current vs. gate voltage of the device shown in FIG. 1. In FIG. 5A, the x-axis represents gate voltage, and the y-axis represents gate current. In this graph, it is seen that a sharp rise occurs at a point "A", at a certain voltage approximately equal to the bandgap of silicon. This represents the accumulation of holes during the write operation at EVB.

Figure 5B:
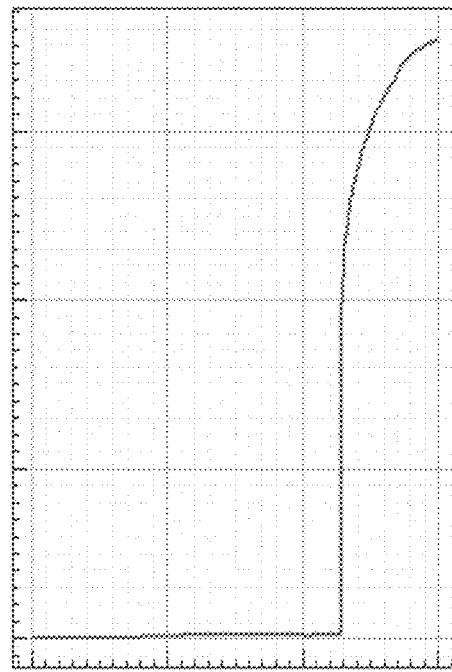
FIG. 5B shows a simulation of body potential vs. gate voltage of the device shown in FIG. 1.

FIG. 5B shows a simulation of body potential vs. gate voltage of the device shown in FIG. 1. In FIG. 5B, the x-axis represents gate voltage, and the y-axis represents body potential. In this graph, it is seen that a sharp rise occurs at a certain voltage evidencing an increase in body potential. This represents the accumulation of electron holes during the write operation at EVB.

FIGS. 6A-6D show fabrication processes for manufacturing of the structure 10 of FIG. 1. It should be understood by those of skill in the art that the fabrication sequences shown in FIGS. 6A-6B are one example of such processes, and that other sequences are also contemplated herein. For example, a sidewall spacer 16 of the gate structure 14 can be fabricated prior to or after the implantation process of the N+ region 22.

More specifically, FIG. 6A shows the substrate 12 with the shallow trench isolation structures 18, 30 formed in the semiconductor layer 12c. In embodiments, the shallow trench isolation structures 30 may extend to the underlying insulator layer 12b, whereas the shallow trench isolation structure 18 may be formed partially within the semiconductor layer 12c.

In embodiments, the shallow trench isolation structures 18, 30 may be formed by conventional lithography, etching and deposition methods known to those of skill in the art. For example, a resist formed over the semiconductor layer 12c is exposed to energy (light) and developed utilizing a conventional resist developer to form a pattern (opening). An etching process with a selective chemistry, e.g., reactive ion etching (RIE), will be used to transfer the pattern from the resist layer to the semiconductor layer 12c to form one or more trenches in the semiconductor layer 12c through the openings of the resist. Following the resist removal by a conventional oxygen ashing process or other known stripants, insulator material (e.g., $SiO_2$) can be deposited by any conventional deposition processes, e.g., chemical vapor deposition (CVD) processes. Any residual material on the surface of the semiconductor layer 12c can be removed by conventional chemical mechanical polishing (CMP) processes. In embodiments, the shallow trench isolation structures 18, 30 may be fabricated in the same or different processes.

FIG. 6B shows fabrication of the gate structure 14. In this fabrication process, a gate dielectric material 14a and gate body 14b are deposited on the semiconductor layer 12c. In embodiments, the gate dielectric material 14a may be deposited to a thickness that permits tunneling of electron and holes to and from the floating body region 14c, for example. In embodiments, the gate dielectric 14a may be a thin gate oxide material or a high-k gate dielectric material, deposited by an ALD method, for example. The gate body 14b may be, e.g., polysilicon material, deposited by a CVD method. The material of the gate dielectric material 14a and gate body 14b are patterned using conventional lithography and etching processes to form the gate structure 14.

In FIG. 6C, the N− region 20 and N+ region 22 are formed by ion implantation processes. For example, a two-step implantation process may be used, where a first N− implant step is performed with an implantation mask protecting the gate structure 14 and other areas but exposing the area where the N− region 20 and N+ region 22 will be formed. The first N− implant forms the N− region 20. The spacer 16 beside the gate structure 14 may then be formed prior to the second N− implant step to form the N+ region 22. Alternatively, the sidewall spacer 16 may be formed beside the gate structure 14, and a N− implant sufficient to form the N+ region 22 can be performed, followed by thermal anneal to form the N− region 20 by diffusion process. In embodiments, the spacer 16 may be left beside the gate structure 14, although it may be removed after silicidation processes, if desired. The implantation mask has a thickness and stopping power sufficient to block masked areas against receiving a dose of the implanted ions. The N− region 20 and N+ region 22 may be doped with n-type dopants, e.g., Arsenic (As), Phosphorus (P) and Sb, among other suitable examples.

FIG. 6C further shows the fabrication process for forming the sidewall spacer 16 on the sidewall of the gate structure 14. As already noted, the sidewall spacer 16 may be formed beside the gate structure 14 prior to a N− implant sufficient to form the N+ region 22. The sidewall spacer 16 may be fabricated by blanket depositing of an insulator material over the entire structure. In embodiments, the insulator material may be an oxide material and/or a nitride material and, preferably SiN. The deposition process may be, for example, CVD. Following the deposition process, the insulator material be by subjected to an anisotropic etching process to remove the material on horizonal surfaces, leaving the sidewall spacer 16. In optional embodiments, the sidewall spacer 16 may be on all sides of the gate structure 14. The etchant can be a dry etch with etchant chemistry of, for example, hot ammonia ($NH_3$) and/or hydrochloric acid (HCl) vapor.

As further shown in FIG. 6D, the body contact 24 and contacts 26 to the body contact 24, gate structure 14 and N+ region 22 may be fabricated according to known CMOS processes. For example, the body contact 24 may be formed by either an ion implant process or a silicide process. In the silicide process, silicide regions may also be formed on the gate structure 14 and the N+ region 22, prior to formation of the contacts 26.

As should be understood by those of skill in the art, the silicide process begins with deposition of a thin transition metal layer, e.g., nickel, cobalt or titanium, over fully formed and patterned semiconductor devices and exposed semiconductor material (e.g., N+ region 22, gate structure 14 and, optionally, on the exposed semiconductor layer 12c between the shallow trench isolation structures 18, 30). After deposition of the thin transition metal layer, the structure is heated allowing the transition metal to react with exposed silicon (or other semiconductor material as described herein) forming a low-resistance transition metal silicide, e.g., NiSi. Following the reaction, any remaining transition metal is removed by chemical etching, leaving silicide contacts on the patterned semiconductor devices and exposed semiconductor material.

The contacts 26 may be formed by conventional contact formation. For example, an interlevel dielectric material may be deposited over the structure, followed by conventional lithography and etching processes to form trenches exposing the N+ region 22, gate structure 14 and body contact 24. A conductor material, e.g., tungsten and any appropriate liner materials, e.g., TaN, TiN, etc., may then be deposited within the trenches. Any excess material on the interlevel dielectric material may be removed by a conventional CMP process.

The ZRAM devices can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a gate structure comprising a gate dielectric material and a gate body;
a body region under the gate dielectric material;
a first doped region laterally adjacent to a first side of the body region;
a second doped region laterally adjacent to the first doped region;
a shallow trench isolation structure laterally adjacent to a second side of the body region; and
a body contact on an opposing side of the shallow trench isolation structure and in electrical connection with the body region.

2. The structure of claim 1, wherein the second doped region is laterally spaced apart from the body region and directly contacts the first doped region.

3. The structure of claim 1, wherein the first doped region comprises an N− region and the second doped region comprises an N+ region, and the first doped region is under a sidewall spacer of the gate structure.

4. The structure of claim 3, further comprising a shallow trench isolation structure extending partially into the N+ region.

5. The structure of claim 4, wherein the body contact is within the body region and comprises a silicide region of semiconductor material electrically connected to the body region.

6. The structure of claim 4, wherein the body contact comprises a P+ region electrically connected to the body region.

7. The structure of claim 4, wherein the body region is a floating P-body region.

8. The structure of claim 1, wherein the gate dielectric material comprises a thickness that exhibits electron/hole tunneling to or from the body region.

9. The structure of claim 1, wherein the shallow trench isolation structure partially extends into a semiconductor layer comprising the body region and further comprising a second shallow trench isolation structure adjacent to the second doped region, the second doped region being between the first doped region and the second shallow trench isolation structure.

10. The structure of claim 9, further comprising a buried insulator layer under the body region, wherein the shallow trench isolation structure does not extend to the buried insulator layer.

11. A structure comprising:
a semiconductor layer;
a gate structure over the semiconductor layer;
a floating body region in the semiconductor layer and under the gate structure;
a body contact electrically connecting to the floating body region;
a shallow trench isolation structure between the body contact and the floating body region;
an N− region laterally adjacent to the body region; and
an N+ region laterally adjacent to the N− region and spaced away from the floating body region.

12. The structure of claim 11, wherein the shallow trench isolation structure extends partially within the semiconductor layer.

13. The structure of claim 11, wherein the shallow trench isolation structure is at a depth such that the body contact electrically connects to the floating body region.

14. The structure of claim 11, wherein the N− region and the N+ region comprise different concentrations of n-type dopant comprising Arsenic.

15. The structure of claim 11, wherein the floating body region is a P+ region.

16. The structure of claim 11, wherein the floating body region is bounded by the N− region, the shallow trench isolation structure and an underlying buried insulator layer.

17. The structure of claim 11, wherein the N+ region is forward biased and is under a sidewall spacer of the gate structure.

18. The structure of claim 11, wherein the floating body region comprises a body potential and the N− region and the N+ region directly contacted one another along their lateral sides.

* * * * *